US006857559B2

(12) United States Patent
Goenka

(10) Patent No.: US 6,857,559 B2
(45) Date of Patent: Feb. 22, 2005

(54) SYSTEM AND METHOD OF SOLDERING ELECTRONIC COMPONENTS TO A HEAT SENSITIVE FLEXIBLE SUBSTRATE WITH COOLING FOR A VECTOR TRANSIENT REFLOW PROCESS

(75) Inventor: Lakhi N. Goenka, Ann Arbor, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 5 days.

(21) Appl. No.: 10/411,494

(22) Filed: Apr. 10, 2003

(65) Prior Publication Data

US 2004/0200878 A1 Oct. 14, 2004

(51) Int. Cl.[7] .............................................. B23K 31/02
(52) U.S. Cl. .................................... 228/200; 228/234.1
(58) Field of Search ............................. 228/46, 180.21, 228/180.22, 200, 222, 230, 234.1; 219/388, 400, 405; 432/121, 245

(56) References Cited

U.S. PATENT DOCUMENTS

| | | | |
|---|---|---|---|
| 3,710,069 A | 1/1973 | Papadopoulos et al. | |
| 4,408,400 A | 10/1983 | Colapinto | |
| 4,725,716 A | 2/1988 | Entwistle et al. | |
| 5,785,233 A | 7/1998 | Nutter et al. | |
| 6,123,247 A | 9/2000 | Shibo et al. | |
| 6,320,691 B1 | 11/2001 | Ouchi et al. | |
| 6,347,734 B1 | 2/2002 | Downes | |
| 6,391,123 B1 * | 5/2002 | Nakamura et al. | 148/24 |
| 6,642,485 B2 * | 11/2003 | Goenka et al. | 219/400 |

* cited by examiner

Primary Examiner—Jonathan Johnson
(74) Attorney, Agent, or Firm—Brinks Hofer Gilson & Lione

(57) ABSTRACT

A method of soldering electronic components to a heat sensitive flexible substrate with cooling for a vector transient reflow process is disclosed. The method comprises applying solder paste to the substrate and placing electronic components to the substrate to form a substrate assembly. The method further includes locating the substrate assembly on a pallet having a heat conductive layer for heat sinking means from the substrate. The method further includes rapid localized heating to a melting temperature sufficient to melt the solder paste using a supplemental heat source. While exposing the deposited solder paste to further rapid localized heating, the method further comprises cooling the pallet at the second surface to diffuse the heat from the substrate defining a temperature gradient across the substrate.

13 Claims, 2 Drawing Sheets

SYSTEM AND METHOD OF SOLDERING ELECTRONIC COMPONENTS TO A HEAT SENSITIVE FLEXIBLE SUBSTRATE WITH COOLING FOR A VECTOR TRANSIENT REFLOW PROCESS

BACKGROUND OF THE INVENTION

The present invention relates to a system and method of soldering electronic components to a heat sensitive flexible substrate with cooling for a vector transient reflow process.

It is well known in the art to mount electronic components to rigid and flexible printed circuit boards. Typically, solder paste is applied to conductor pad regions on the rigid or flexible substrate. Components are then placed in their terminals contacting the solder paste in the pad regions. The substrate is then exposed to relatively high temperatures to activate the solder paste which melts and then solidifies to bond and electrically connect the components on to the substrate. The flexible substrates are typically made from polyimide, which exhibits good stability when exposed to high temperatures.

Moreover, pallets which receive and support the substrate during a vector transient reflow process are typically made of various materials, such as polymers, to absorb heat from the substrate. Manufacturers have been challenged in improving heat sinking means for transferring heat away from the substrate to lessen substrate degradation or warpage due to heat absorption. In many situations, at least a degree of substrate warpage or degradation is experienced due to the high temperatures.

While the prior art teachings achieve their intended purpose, significant improvements are needed. For example, it is desirable to eliminate or lessen warpage on the substrate of the printed circuit board. In many situations, the substrate which typically is made of a plastic material, e.g., polyethylene terephthalate (PET), is heated to temperatures greater than 250° C. Without proper heat sinking means, the substrate may experience warpage or bending due to the high temperatures in the oven. As known, substrate warpage affects mechanical accuracies of the printed circuit board, mechanical properties of the substrate, and heat transfer capabilities of the printed circuit board.

BRIEF SUMMARY OF THE INVENTION

Thus, it is an aspect of the present invention to provide a system and method of soldering electronic components to a heat sensitive flexible substrate with cooling for a vector transient reflow process.

It is another aspect of the present invention to provide a thermally conductive pallet for a vector transient reflow process of a heat sensitive flexible substrate to allow for an improved heat transfer across the substrate.

It is yet another aspect of the present invention to provide a cooling source for cooling a second surface of the pallet to provide cooling to defuse heat from the substrate defining a temperature gradient across the substrate, while providing additional heat energy to reflow the solder.

One embodiment of the present invention includes applying solder paste to the substrate and placing electronic components on the substrate to form a substrate assembly. The method further includes locating the substrate assembly on a pallet having a heat conductive material for heat sinking means from the substrate. The heat conductive material has first and second opposite surfaces. The first surface is configured to receive the substrate disposed thereon to diffuse heat from the substrate during the vector transient reflow process. The method further includes preheating the substrate assembly to a first elevated temperature below a softening temperature of the deposited solder paste and exposing the deposited solder paste to further rapid localized heating to a melting temperature sufficient to melt the solder paste using a supplemental heat source. The method further includes cooling the pallet at the second surface to diffuse the heat from the substrate defining a temperature gradient across the substrate, while exposing the deposited solder paste to further rapid localized heating.

Other objects and advantages of the present invention will become apparent upon considering the following detailed description and appended claims, and upon reference to the accompanying drawings.

DETAILED DESCRIPTION OF THE INVENTION

Figure 1:
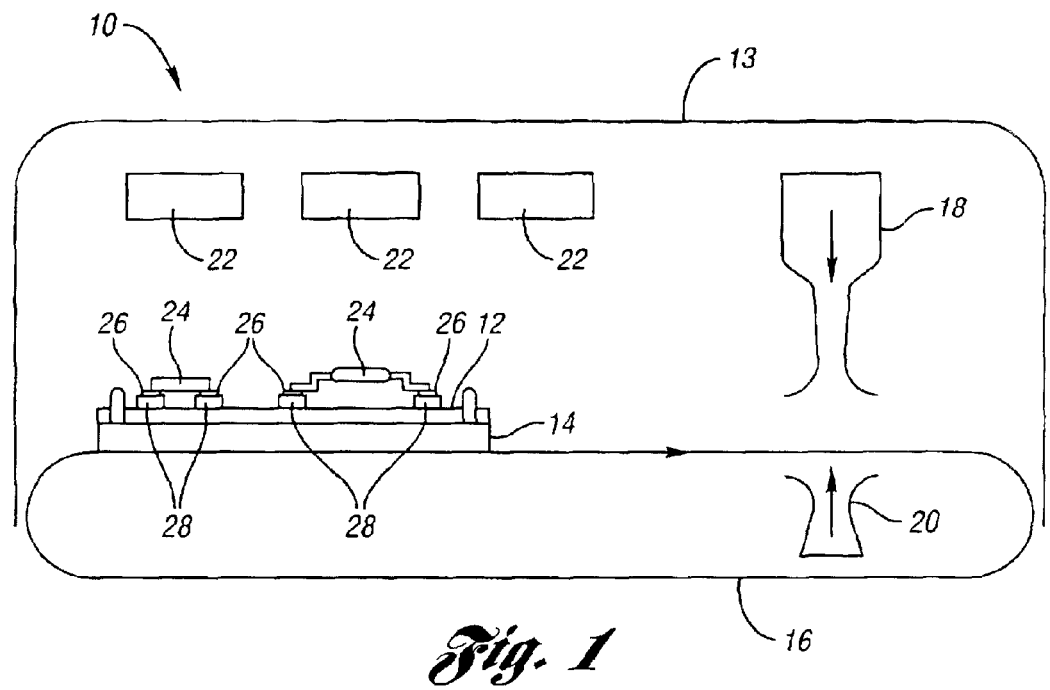
FIG. 1 is a schematic representation of an apparatus for soldering electronic components to a heat sensitive flexible substrate with cooling for a vector transient reflow process in accordance with one embodiment of the present invention.

A system 10 for reflowing solder to electrically interconnect electronic components to a flexible or semi-flexible substrate 12 is illustrated in FIG. 1, in accordance with the present invention. The substrate may be made of any suitable material such as PET or polyethylene naphthalate (PEN) film. Further, system 10 includes a pallet 14 that provides a means to mount circuit components on flexible substrate 12 without degrading the material properties of the substrate. System 10 additionally includes a reflow oven 13, a conveyor system 16, a gas nozzle 18 and a pallet 14. The reflow oven 13 has a plurality of heaters 22 to pre-heat the substrate 12 to a desired temperature. Conveyor system 16 is configured in a conventional manner to cooperatively receive pallets 14 for movement through the reflow oven 13.

A system and method for mounting electronic components on to flexible substrates are discussed in U.S. patent application serial No. 60/237,650, filed Oct. 3, 2000, and international patent application No. PCT/US01/31122, filed Oct. 3, 2001, both of which are incorporated herein by reference.

In this embodiment, pallet 14 is a heat conductive pallet 14 for reflowing solder paste to interconnect electronic components 24 to flexible substrates 12, in accordance with the present invention. Pallet 14 is made of a heat conductive material, e.g., aluminum, for heat sinking means from the substrate 12. The heat conductive material has first and second opposite surfaces wherein the first surface is configured to receive the substrate disposed thereon to diffuse heat from the substrate during the vector transient reflow process. Pallet 14 is configured to support substrate 12 and cooperates with conveyor system 16 to transport substrate 12 through oven 13. Heaters 22 of oven 13 pre-heat substrate 12, and hot gas nozzle 18 provides supplemental heating. Solder paste 26 is printed on conductor pads 28 disposed on substrate 12 on which components 24 are placed.

Conveyor system 16 further includes a cooling source, e.g., a cool gas nozzle 20 disposed adjacent the second surface of the pallet 14 and opposite the hot gas nozzle 18. The cooling source provides cooling to the pallet to diffuse heat from the substrate defining a temperature gradient across the substrate, while providing additional heat energy to reflow the solder. It has been determined that the heat conductive material, such as aluminum, is able to substantially uniformly cool or heat. Thus, when cool gas is introduced onto the second surface of the pallet, substantially the entire pallet experiences a change in temperature. Thus, providing cool gas via the cool gas nozzle 20, the heat conductive material substantially uniformly cools thereby allowing heat to be transferred from the substrate to the pallet in a more effective manner. This allows for a greater temperature gradient across the substrate.

Figure 2:
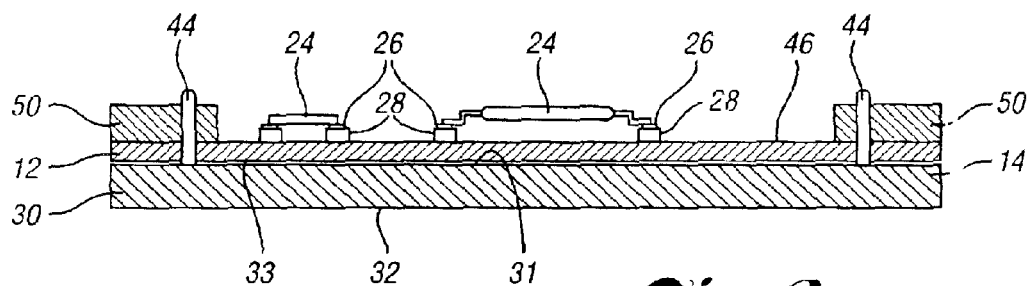
FIG. 2 is a cross-sectional view of one embodiment of a heat conductive pallet to receive the substrate during the vector transient reflow process.

As shown in FIG. 2, the pallet 14 includes a heat conductive material to receive a substrate for a printed circuit board in a vector transient reflow process in accordance with one embodiment of the present invention. The pallet 14 includes a heat conductive material, e.g., aluminum, for heat sinking means from the substrate 12. In this embodiment, the heat conductive material may include copper, aluminum, steel or any other suitable conductive material. The heat conductive layer 30 has first and second opposite surfaces 31, 32. As shown, the first surface 31 has a peripheral area 33 and is configured to receive the substrate 12 disposed thereon during the vector transient reflow process of the substrate 12.

It is to be noted that the material comprising the heat conductive layer 30 may include any other suitable material having diffusivity characteristics or conductive characteristics so that heat may be transferred from the substrate to protect the substrate from heat degradation.

Figure 3:
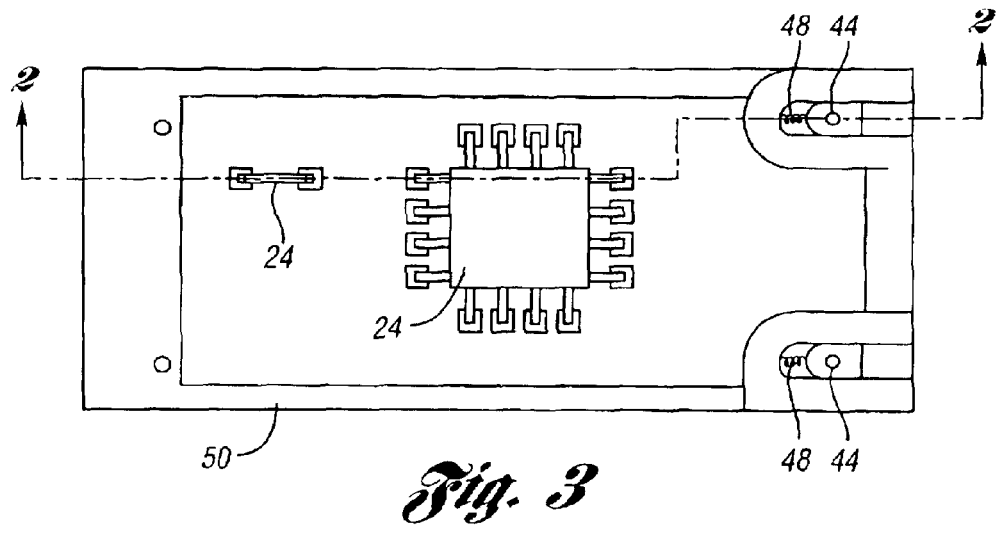
FIG. 3 is a plan view of the heat conductive pallet receiving a flexible substrate on which electronic components are mounted on both exposed sides of the substrate in accordance with one embodiment of the present invention.

Referring to FIGS. 2 and 3, a cross-sectional view of pallet 14 is illustrated, in accordance with the present invention. Support pins 44 are provided on pallet 14 to hold substrate 12 flat or planar on a pallet surface 46. Pins 44 may be tensioned or loaded by springs 48 to provide a tensioning force on substrate 12. In an embodiment of the present invention, a picture frame 50 may be used to secure substrate 12 against pallet surface 46. Picture frame 50, as illustrated attaches to and secures the periphery of substrate 12 to hold the edges of substrate 12 against surface 46 of the pallet.

In one embodiment of the present invention, substrate 12 is a polyester film having a thickness of 0.003 to 0.010 inches. Copper conductors (not shown) and solder pads (not shown) may be formed on both surfaces of the substrate, as is well known in the art. A suitable solder mask (not shown) is applied over copper conductors so that only the pad areas on which solder paste is to be printed are exposed. These pads may have a suitable surface finish such as an organic surface finish to protect the pad surfaces from oxide formation. Other surface finishes such as immersion silver or electroplated tin may be used to enhance the solderability of components 24 to the pads.

Solder pastes that have compositions containing lead, as well as solder pastes having lead-free compositions may be used. The solder pastes containing lead generally have a lower melting temperature of about 183° to 200° C., while lead-free solder compositions have melting temperatures of about 220° to 245° C.

In operation, as pallet 14 having substrate 12 affixed thereon is transported through the pre-heat zones in oven, the solder paste is activated and gradually heated to just below its melting temperature. During this process, the heat conductive material of the pallet begins to absorb heat from the oven 13 as well as from the substrate 12, which thereby lowers the temperature of the substrate. The supplemental heat created from gas nozzle 18 is utilized to provide a focused and concentrated heat source. Hot gas nozzle 18 provides heat to the exposed substrate surface for a short duration. The solder paste 26, conductor pads 28, and copper regions of substrate preferable absorb heat because of their high thermal diffusivity, while substrate 12 is maintained at a lower temperature by the pallet 14, which is held at a lower temperature by the heat conductive layer and heat insulative layer.

At the same time, cool gas nozzle 20 provides cool gas to the second surface of the pallet for cooling means. By way of the nature of the heat conductive material, the pallet substantially uniformly cools allowing additional heat to be transformed across the pallet. In turn, this increases the temperature across the substrate thereby allowing more heat to pass through the substrate and avoiding warpage or degradation of the substrate. In this manner, softening and damage to substrate 12 during the reflow process is prevented or lessened.

After the exposed region of the substrate passes below gas nozzle 18, the temperature of the exposed electronic component 24 and substrate 12 rapidly falls so that the activated solder cools and solidifies. A reliable electrical connection between the conductors or pads 20 and components 24 is thus formed.

Figure 4:
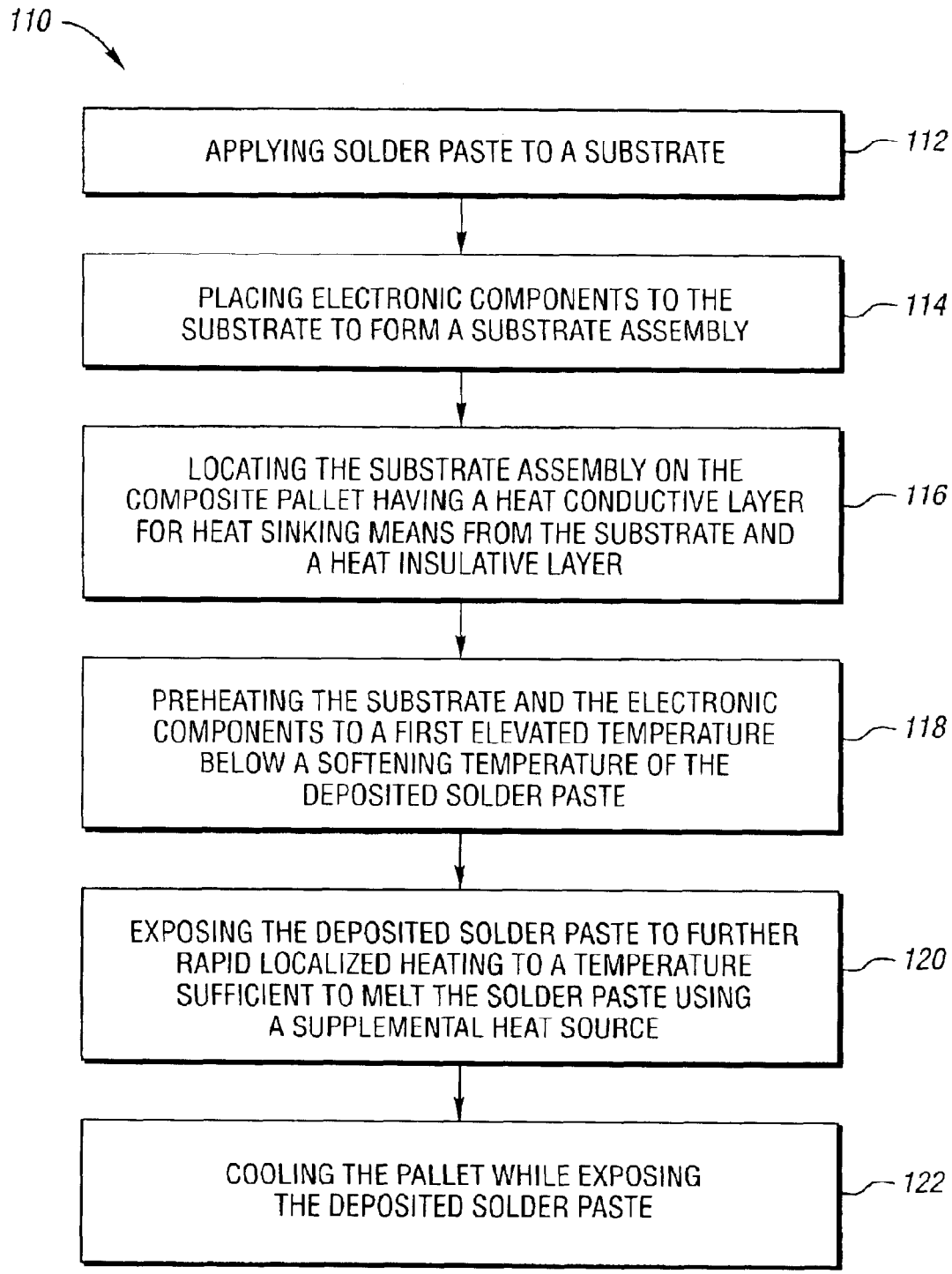
FIG. 4 is a flowchart depicting one method of soldering electronic components to a heat sensitive flexible substrate with cooling for a vector transient reflow process.

FIG. 4 illustrates one method 110 of soldering electronic components of a heat sensitive flexible substrate with cooling for a vector transient reflow process. As shown, method 110 includes applying solder paste to the substrate in box 112 and placing electronic components on the substrate to form a substrate assembly in box 114. The method further includes locating the substrate assembly on a pallet having a heat conductive material for heat sinking means from the substrate in box 116. In this embodiment, the heat conductive material has first and second opposite surfaces wherein the heat conductive material includes aluminum, aluminum alloy, or any other suitable heat conductive material. The first surface is configured to receive the substrate disposed thereon to diffuse heat from the substrate during the vector transient reflow process.

As shown, method 110 further includes preheating the substrate assembly to a first elevated temperature below a softening temperature of the deposited solder paste. In this embodiment, the first elevated temperature is about 90° to 115° Celsius. The method may further include transporting the pallet under a supplemental heat source using a conveyor.

Method 210 further includes exposing in box 120 the deposited solder paste to further rapid localized heating to a melting temperature sufficient to melt the soldering paste using a supplemental heat source. In this embodiment, the supplemental heat source is a hot gas nozzle, wherein hot gas is directed onto the substrate. In this embodiment, the hot gas is at a temperature of about 130° to 175° Celsius. The melting temperature is between about 180° and 260° Celsius, preferably about 220° Celsius.

At the same time, method 210 further includes cooling the pallet at the second surface to diffuse the heat from the substrate defining a temperature gradient across the substrate while exposing the deposited solder paste to further rapid localized heating in box 122. In this embodiment, the cool gas nozzle is at a temperature of about 65°. The melting temperature is between about 180° and 260° Celsius, preferably about 220° Celsius. In this embodiment, the step of cooling the pallet includes directing cool gas onto the second surface of the pallet using a cool gas nozzle. The cool gas nozzle has a predetermined outlet diameter and is positioned a predetermined distance from the second surface of the pallet. In this embodiment, the ratio of the predetermined distance to the predetermined diameter of the cool gas nozzle is about less than 14. For example, the predetermined distance from the second surface of the pallet may be about 98 centimeters and the predetermined diameter of the cool gas nozzle may be about 7.0 centimeters. Thus, an improved temperature gradient across the substrate is created which may be up to about 45° Celsius. This is achieved since the heat conductive material when cooled cools substantially uniformly such that the first surface of the pallet is able to allow an improved heat transfer from the substrate.

The foregoing discussion discloses and describes the preferred embodiment of the invention. One skilled in the art will readily recognize from such discussion, and from the accompanying drawings and claims, that changes and modifications can be made to the invention without departing from the true spirit and fair scope of the invention as defined in the following claims. The invention has been described in an illustrative manner, and it is to be understood that the terminology which has been used is intended to be in the nature of words of description rather than of limitation.

What is claimed is:

1. A method of soldering electronic components to a heat sensitive flexible substrate with cooling for a vector transient reflow process, the method comprising:
   applying solder paste on the substrate;
   placing electronic components to the substrate to form a substrate assembly;
   locating the substrate assembly on a pallet having a heat conductive material for heat sinking means from the substrate, the heat conductive material having first and second opposite surfaces, the first surface being configured to receive the substrate disposed thereon to diffuse heat from the substrate during the vector transient reflow process;
   preheating the substrate assembly to a first elevated temperature below a softening temperature of the deposited solder paste;
   exposing the deposited solder paste to further rapid localized heating to a melting temperature sufficient to melt the solder paste using a supplemental heat source; and
   directing cool gas onto the second surface of the pallet with a cool gas nozzle to cool the pallet at the second surface and to diffuse the heat from the substrate defining a temperature gradient across the substrate, while exposing the deposited solder paste to further rapid localized heating.

2. A method of soldering electronic components to a heat sensitive flexible substrate with cooling for a vector transient reflow process, the method comprising:
   applying solder paste on the substrate;
   placing electronic components to the substrate to form a substrate assembly;
   locating the substrate assembly on a pallet having a heat conductive material for heat sinking means from the substrate, the heat conductive material having first and second opposite surfaces, the first surface being configured to receive the substrate disposed thereon to diffuse heat from the substrate during the vector transient reflow process;
   preheating the substrate assembly to a first elevated temperature below a softening temperature of the deposited solder paste;
   exposing the deposited solder paste to further rapid localized heating to a melting temperature sufficient to melt the solder paste using a supplemental heat source; and
   cooling the pallet at the second surface to diffuse the heat from the substrate defining a temperature gradient of up to about 45° Celsius across the substrate, while exposing the deposited solder paste to further rapid localized heating.

3. The method of claim 1 wherein the cool gas nozzle is at a temperature of about 50° Celsius to 200° Celsius.

4. The method of claim 1 wherein the cool gas nozzle has a predetermined outlet opening and is positioned a predetermined distance from the second surface of the pallet.

5. The method of claim 4 wherein the ratio of the predetermined distance to the predetermined width is about less than 14.

6. The method of claim 1 wherein the step of exposing includes directing hot gas onto the substrate using the hot gas nozzle.

7. The method of claim 6 wherein the hot gas is at a temperature of about 200° Celsius to 450° Celsius.

8. The method of claim 1 wherein the pallet is made of a thermally conductive material.

9. The method of claim 8 wherein the thermally conductive material includes aluminum and aluminum alloy.

10. The method of claim 1 wherein the first elevated temperature is about 90° to 115° Celsius.

11. The method of claim 1 wherein the melting temperature is between about 180 and 259° Celsius.

12. The method of claim 1 wherein the melting temperature is about 220° Celsius.

13. The method of claim 1 further comprising transporting the pallet under a supplemental heat source using a conveyer.

* * * * *